(12) United States Patent
Shih et al.

(10) Patent No.: US 11,289,492 B1
(45) Date of Patent: Mar. 29, 2022

(54) SEMICONDUCTOR STRUCTURE AND METHOD OF MANUFACTURING THEREOF

(71) Applicant: NANYA TECHNOLOGY CORPORATION, New Taipei (TW)

(72) Inventors: Chiang-Lin Shih, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/092,349

(22) Filed: Nov. 9, 2020

(51) Int. Cl.
*H01L 21/00* (2006.01)
*H01L 27/108* (2006.01)
*H01L 23/528* (2006.01)
*H01L 21/768* (2006.01)

(52) U.S. Cl.
CPC .. *H01L 27/10885* (2013.01); *H01L 21/76805* (2013.01); *H01L 21/76816* (2013.01); *H01L 23/528* (2013.01); *H01L 27/10888* (2013.01); *H01L 21/76834* (2013.01)

(58) Field of Classification Search
CPC ......... H01L 27/10885; H01L 21/76805; H01L 27/10888
See application file for complete search history.

(56) References Cited

U.S. PATENT DOCUMENTS

| | | | | |
|---|---|---|---|---|
| 10,818,592 B1* | 10/2020 | Lin | ...................... | H01L 23/5256 |
| 10,937,791 B1* | 3/2021 | Huang | .............. | H01L 27/10873 |
| 11,094,632 B2* | 8/2021 | Wu | ..................... | H01L 21/76877 |
| 11,114,334 B2* | 9/2021 | Chou | ..................... | H01L 23/528 |
| 11,114,441 B1* | 9/2021 | Lin | ........................ | H01L 23/585 |
| 2013/0320558 A1* | 12/2013 | Kim | .................. | H01L 27/10888 |
| | | | | 257/774 |
| 2015/0028492 A1* | 1/2015 | Jung | ................. | H01L 21/76831 |
| | | | | 257/774 |
| 2018/0350611 A1* | 12/2018 | Kim | ................... | H01L 21/76832 |
| 2020/0083055 A1* | 3/2020 | Kim | ................... | H01L 21/76879 |
| 2020/0343253 A1* | 10/2020 | Lin | .................... | H01L 27/10808 |
| 2021/0043634 A1* | 2/2021 | Huang | ............ | H01L 27/10891 |
| 2021/0074578 A1* | 3/2021 | Chou | ................. | H01L 21/76837 |
| 2021/0074707 A1* | 3/2021 | Su | .............................. | G11C 5/02 |
| 2021/0098389 A1* | 4/2021 | Wu | .................... | H01L 21/76837 |
| 2021/0175169 A1* | 6/2021 | Li | ........................ | H01L 27/10855 |
| 2021/0296158 A1* | 9/2021 | Chou | .................. | H01L 23/5329 |

* cited by examiner

*Primary Examiner* — Laura M Menz
(74) *Attorney, Agent, or Firm* — CKC & Partners Co., LLC

(57) ABSTRACT

A semiconductor structure includes a substrate and a bit line. The substrate has a plurality of active areas and isolation areas. Each isolation area is located between immediately-adjacent two of the active areas to isolate the active areas from each other. The first bit line is formed on a first active area of the active areas. A bottom portion of the first bit line extends within the first active area. The extending bottom portion is surrounded by the first active area.

7 Claims, 8 Drawing Sheets

SEMICONDUCTOR STRUCTURE AND METHOD OF MANUFACTURING THEREOF

BACKGROUND

Field of Invention

The present disclosure relates to semiconductor devices. More particularly, the present disclosure relates to semiconductor memory devices.

Description of Related Art

A conventional DRAM cell includes a transistor and a capacitor coupled thereto. When density of the DRAM increases, the channel length of a traditional planar transistor is reduced, causing the short channel effects that include the drain-induced barrier lowering (DIBL), and so forth.

Shrinking of the device size reduces the distance between word lines and bit lines, and eventually induces higher parasitic capacitance or unexpected connections between such word lines and bit lines. For example, conductive material residual risk at bottom after bit line etching appears and cause unexpected connections bit lines.

SUMMARY

One aspect of the present disclosure relates to a semiconductor structure.

According to one embodiment of the present disclosure, a semiconductor structure includes a substrate and a bit line. The substrate has a plurality of active areas and isolation areas. Each isolation area is located between immediately-adjacent two of the active areas to isolate the active areas from each other. The first bit line is formed on a first active area of the active areas. A bottom portion of the first bit line extends within the first active area. The extending bottom portion is surrounded by the first active area.

In one or more embodiments, the bottom portion of the first bit line has a first width at a level of a top of the first active area. An end of the bottom portion within the first active area has a second width. The first width is greater than the second width.

In one or more embodiments, the first bit line includes a conductive structure and an insulating layer. The conductive structure is located at the bottom portion. The conductive structure extends within the first active area. The insulating layer is located between the conductive structure and the first active area. The insulating layer surrounds the conductive structure. The conductive structure is exposed from an end of the bottom portion to be connected to the first active area.

In one or more embodiments, the mentioned semiconductor structure further includes an oxide layer and a nitride layer. The oxide layer is formed on the substrate. The nitride layer is formed on the oxide layer. The first bit line extends within the first active area through the oxide layer and the nitride layer.

In some embodiments, the mentioned semiconductor structure further includes a second bit line formed on the nitride layer and aligned with a first isolation area of the isolation areas. A second isolation area of the isolation areas is located between the first isolation area and the first active area.

One aspect of the present disclosure relates to a method of semiconductor structure manufacturing.

According to one embodiment of the present disclosure, a method of manufacturing includes following operations. Provide a substrate having a plurality of active areas. Form a sacrificial layer on the substrate. Form a plurality of first openings respectively aligned with the active areas. Each first opening has a width less than a width of the corresponding active area. Extend bottoms of the first openings within the active areas to form a plurality of trenches. Form a plurality of first bit lines in the trenches, wherein each first bit line is connected to the corresponding active area. Remove the sacrificial layer.

In one or more embodiments, the substrate further has a plurality of isolation areas. Each isolation area is located between immediately-adjacent two of the active areas to isolate the active areas from each other.

In some embodiments, the method of semiconductor structure manufacturing further includes following operations. Form a plurality of second openings in the sacrificial layer. Each second opening is located between two immediately-adjacent first openings and aligned with a corresponding one of the isolation areas. Form second bit lines in the second openings.

In some embodiments, before forming the first openings and the second openings, the method of semiconductor structure manufacturing further includes following operations. Form a plurality of masks on the sacrificial layer. Reversely etch the masks and the sacrificial layer such that sacrificial layer has portions corresponding to the masks are removed to form the first openings and the second openings.

In some embodiments, the method of semiconductor structure manufacturing further includes following operations. Form protecting hard masks in the second openings before forming the trenches. Remove the protecting hard masks after forming the trenches.

In some embodiments, the method of semiconductor structure manufacturing further includes following operations. Form spacers covering the first bit lines after removing the sacrificial layer.

In summary, a self-aligned manufacturing is performed through the mentioned method. The sacrificial layer makes formed bit lines be aligned to corresponding active areas or isolation areas. The sacrificial layer further avoids conductive material residual risk out of corresponding active areas or isolation areas. In the formed semiconductor structures, widths of the formed bit lines are less than width of corresponding active areas and isolation areas, and unexpected electrical connection can be reduced.

The foregoing has outlined rather broadly the feature and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purpose of the present disclosure. It should also be realized by those skilled in the art that such equivalent constructions do not depart from the spirit or scope of the disclosure as set forth in the appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
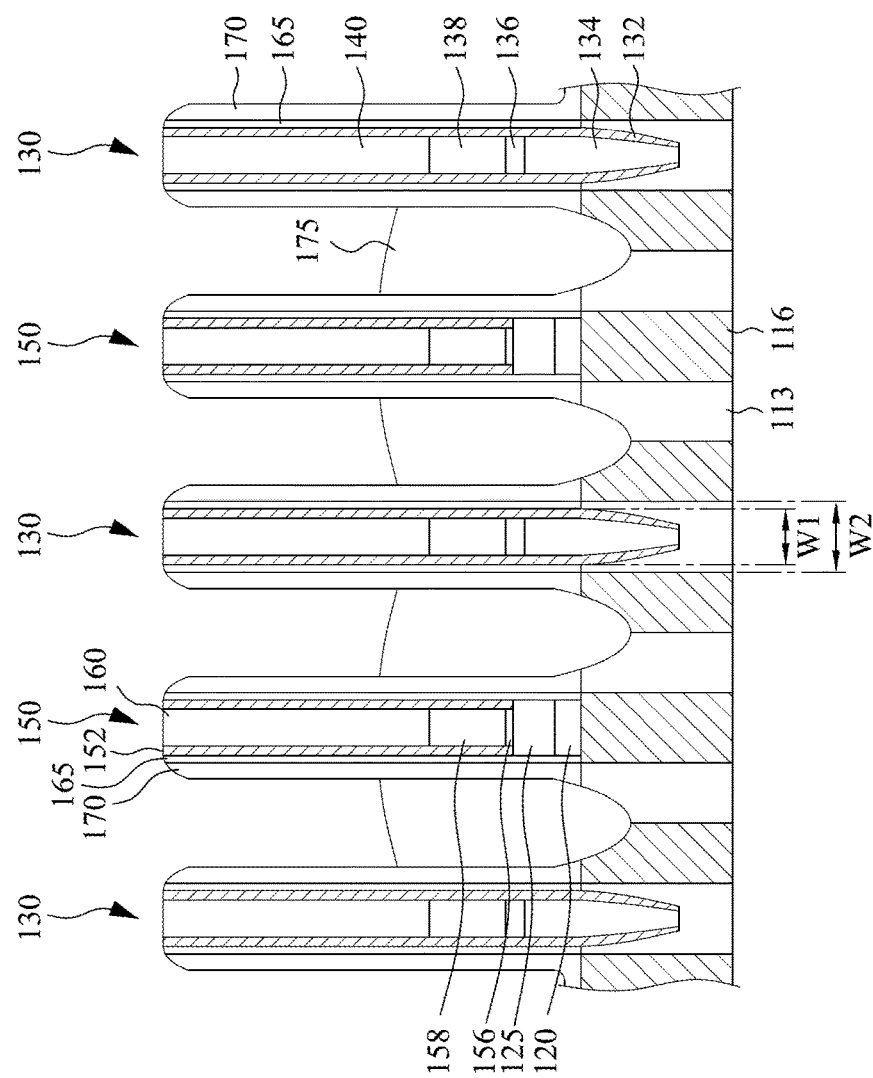
FIG. 1 illustrates a cross-section view of a semiconductor structure according to one embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to the drawings, the illustrated thickness of the layers and areas may be exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate.

It shall be understood that although the terms first, second, third, etc. may be used herein to describe various elements, components, areas, layers, or sections, these elements, components areas, layers, or sections are not limited by these terms. Rather, these terms are merely used to distinguish one element, component, area, layer, or section from another area, layer or section. Thus, a first element, component, area, layer, or section discussed below could be termed a second element, component, area, layer, or section without departing from the teachings of the present disclosure.

The terminology used herein for the purpose of describing particular embodiments only and is not intended to be limited to the present disclosure concept. As used herein, the singular forms "a", "an" and "the" are intended to include the plural forms as well, unless the context clearly indicates otherwise. It shall be further understood that the terms "comprises" and "comprising", when used in the specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Reference is made by FIG. 1. FIG. 1 illustrates a cross-section view of a semiconductor structure 100 according to one embodiments of the present disclosure.

As shown in FIG. 1, in this embodiment, a semiconductor structure 100 includes a substrate 110, first bit lines 130 and second bit lines 150. The first bit lines 130 and the second bit lines 150 are formed on the substrate 110 and electrically disconnected to each other.

In this embodiment, the substrate 110 includes active areas 113 and isolation areas 116. In FIG. 1, each isolation area 130 is located between immediately-adjacent two of the active areas 113, thereby isolating the two immediately-adjacent active areas 113 from each other. The first bit lines 130 are respectively formed on the active areas 113. To avoid unexpected electrical connections of the formed first bit lines 130, each isolation area 116 is located between immediately-adjacent two of the active areas 113 to isolate the active areas 113 from each other.

In some embodiment, the active area 113 includes a plurality of active device including transistors or controlling circuit. Specifically, in some embodiments, each active area 113 has a memory cell, which includes 1T1C memory cell formed by a transistor and a capacitor but not limited. The first bit lines 130 formed on the active areas 113 can be used to load the data stored by the memory cell in the active areas 113. Each of the second bit lines 150 is aligned with and formed upon a corresponding isolation area 116. The second bit lines 150 are disconnected to the active areas 113. In some embodiments, the second bit lines 150 can be connected to other active device beyond the active area 113, and second bit lines 150 configured between the two first bit lines 130 can save occupied area of the substrate 110 in which the first bit lines 130 and the second bit lines 150 are formed.

In this embodiment, a bottom portion of each of the first bit lines 130 extends within a corresponding one of the active areas 113. Each extending bottom portion of the first bit lines 130 is surrounded by the corresponding active area 113. As shown in FIG. 1, one of the bottom portions of the first bit lines 130 has a width W2 at a level of a top of the first active area 113. The bottom portion of the first bit lines 130 further extends within the active 113 area from the top of the active area 113. Therefore, each of the bottom portions of the first bit lines has an end having a width W1 within the active area 113, and the width W2 is greater than width W1.

In this embodiment, each of the first bit lines 130 includes an insulating layer 132, conductive structures 134, 136 and 138 and a nitride layer 140. For each first bit line 130, the conductive structure 134 is at the bottom portion of the first bit line 130, and the conductive structure 134 extends with the active area 113. The insulating layer 132 is located between the conductive structure 134 and the active area 113. The conductive structure 134 is exposed from the insulating layer 132 to contact the active area 113. The conductive structures 136 and 138 are stacked on the conductive structure 134 sequentially.

In some embodiments, material of the conductive structure 134 includes poly-Silicon.

In some embodiments, material of the conductive structure 136 includes Titanium nitride (TiN). In some embodiments, material of the conductive structure 138 includes tungsten (W). Therefore, the conductive structures 136 and 138 can enhance overall strength of the first bit line 130.

As shown in FIG. 1, in this embodiment, each of the first bit lines 130 includes spacing layers 165 and 170 surrounding the insulating layer 132, the conductive structures 134, 136 and 138 and a nitride layer 140. The nitride layer 140 covers and protects the conductive structures 134, 136 and 138. In this embodiment, the nitride layer 140 of each first bit line 130 is exposed from the spacing layers 165 and 170, and the nitride layer 140 prevents the conductive structures 134, 136 and 138 being exposed. In some embodiments, material of the spacing layers 165 and 170 are non-conductive to avoid unexpected current leakage from first bit lines 130.

In FIG. 1, the second bit lines 150 are respectively formed on the isolation areas 116 and located between two immediately-adjacent first bit lines 130. As mentioned above, in this embodiment, the first bit lines 130 and the second bit lines 150 are integrated together to save occupied area. In some embodiments, the second bit lines 150 can be connected to other active devices beyond the active areas 113 on the substrate 110.

In this embodiment, at least one isolation area 116, in which none of the first bit lines 130 and the second bit lines 150 is formed upon, is located between the two immediately-adjacent first bit line 130 and second bit line 150, thereby avoiding current leakage between the two immediately-adjacent first bit line 130 and second bit line 150 through the unexpected connection of the active area 113 and the isolation area 116.

In this embodiment, each of the second bit lines 150 is located on an oxide layer 120 and a nitride layer 125, and bottom portions of the second bit lines 150 have difference height with respect to the bottom portions of the first bit lines 130. The oxide layer 120 and the nitride layer 125 avoid unexpected electrical connections between active areas 113 and the second bit lines 150 if the second bit lines 150 extend out of the isolation areas 116.

As shown in FIG. 1, in this embodiment, each of second bit lines 150 includes an insulating layer 152, conductive structures 156 and 158 and a nitride layer 160. Similarly, the nitride layer 160 of each second bit line 150 is exposed from the spacing layers 165 and 170, and the nitride layer 160 prevents the conductive structures 156 and 158 being exposed. In some embodiments, material of the conductive structure 156 includes Titanium nitride (TiN). In some embodiments, material of the conductive structure 158 includes tungsten (W). Therefore, the conductive structures 156 and 158 can enhance overall strength of the second bit line 150.

In this embodiment, the semiconductor structure further includes spacing material 175, which is formed on the substrate 110 and located between two immediately-adjacent ones of the first bit lines 130 and the second bit lines 150, thereby isolating the first bit lines 130 and the second bit lines 150. In some embodiments, the spacing material is non-conductive.

Reference is made by FIGS. 2A-2G. FIGS. 2A-2G illustrate cross-section views during different operations of a method of semiconductor structure manufacturing according to one embodiments of the present disclosure.

Figure 2A:
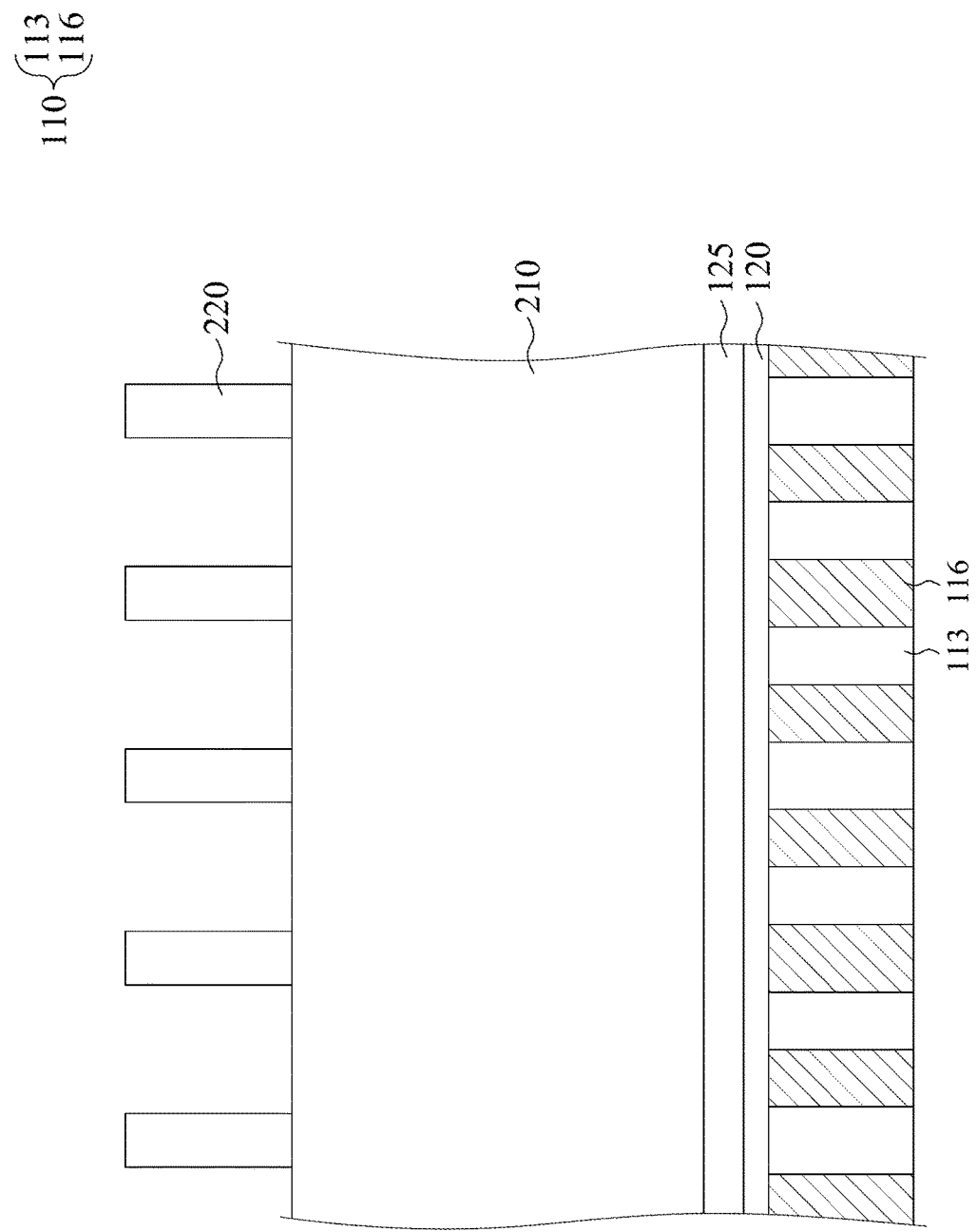
FIGS. 2A-2G illustrate cross-section views during different operations of a method of semiconductor structure manufacturing according to one embodiments of the present disclosure.

As shown in FIG. 2A, a substrate 100 having a plurality of active areas 113 is formed. In this embodiment, the substrate 100 further has a plurality of isolation areas 116. The active areas 113 and isolation areas 116 are staggered on the substrate 110. Each of the isolation areas 116 is located between immediately-adjacent two of the active areas 113 to isolate the active areas 113 from each other.

In this embodiment, an oxide layer 120 and a nitride layer 125 are formed on the substrate 110. As mentioned above, the oxide layer 120 and the nitride layer 125 can be used to avoid unexpected connection. For details, please refer to following discussion.

Then, form a sacrificial layer 210 on the substrate 110. In this embodiment, the sacrificial layer 210 can be deposited on the nitride layer 125 upon the substrate 110. In some embodiments, material of the sacrificial layer includes oxide. In FIG. 2A, a plurality of first hard masks 220 is further formed on the sacrificial layer 210. Each of the first hard masks 210 is aligned with a corresponding one of the active areas 113 and the isolation areas 116.

In some embodiments, the first hard masks 220 are made from carbon. The carbon first hard masks can be used for reverse etching, so that a plurality of openings corresponding to the first hard mask 210 can be formed within the sacrificial layer 210 in the following operations.

Figure 2B:
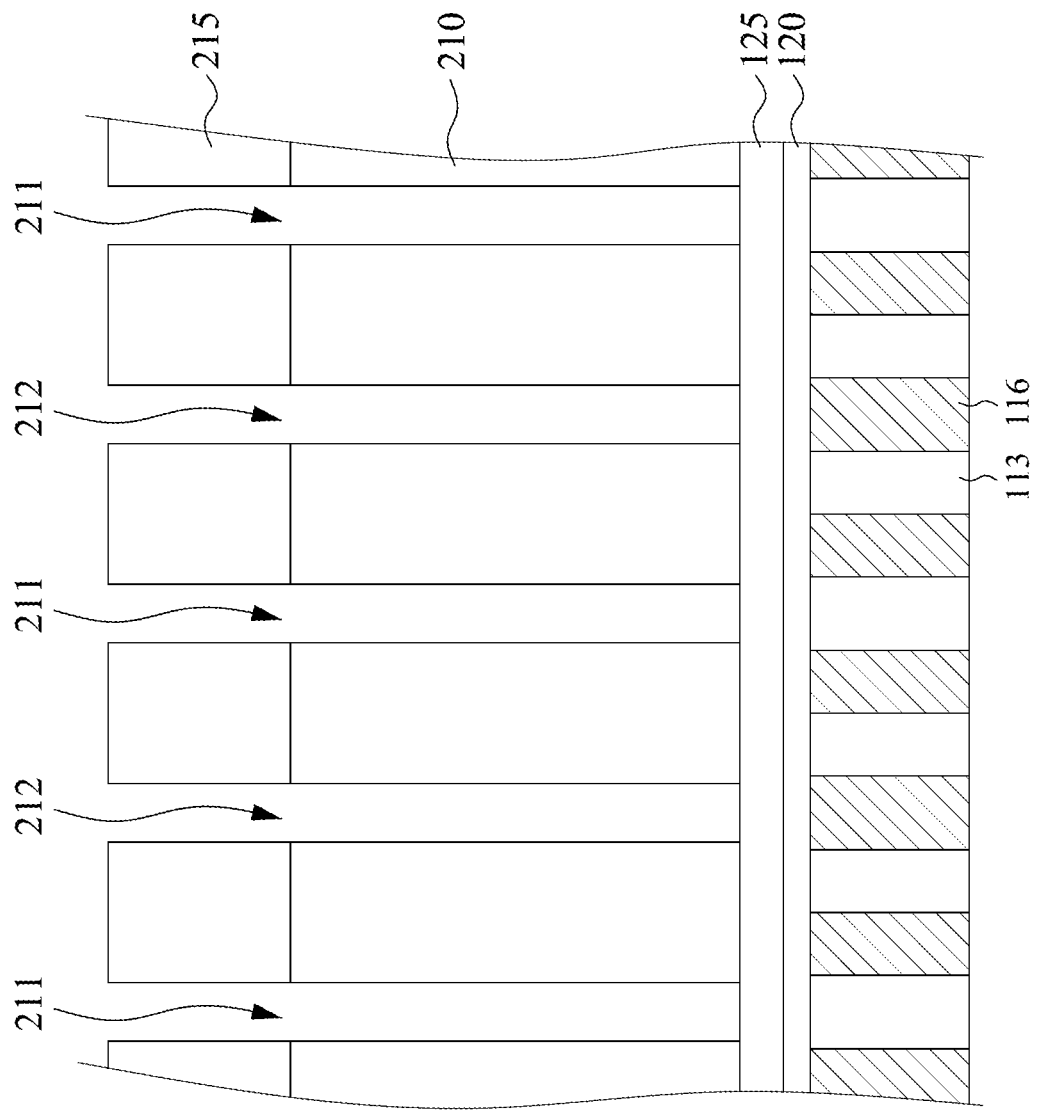

Proceed to FIG. 2B, a plurality of first openings 211 are formed aligned with the active areas 113 respectively, and form a plurality of second openings 212 are formed aligned with the isolation areas 116 respectively. Each of the second openings 212 is located between two immediately-adjacent first openings 211 and aligned with a corresponding one of the isolation areas 116. As mentioned above, the oxide layer 120 and the nitride layer 125 are formed on the substrate, and the first openings 211 and the second openings 212 extend to a top surface of the nitride layer 125.

As shown in FIG. 2B, in this embodiment, the first hard masks 220 and the sacrificial layer 210 are reversely etched such that the sacrificial layer 210 has portions corresponding to the first hard masks 220 are removed to form the first openings 211 and the second openings 212.

For details, in some embodiments, the operation of reversely-etching shown in FIGS. 2A and 2B can be performed in following steps. After the first hard masks 220 are formed, a sacrificial material 215 is formed on the sacrificial layer 210 and filled into intervals between the first hard masks 220. Then, the first hard masks 220 are removed to expose the sacrificial layer 220, and exposed portions of the sacrificial layer 210 are etched to form the first openings 211 and the second openings 212. In some embodiments, the sacrificial material 215 includes nitride.

After the reversely-etching, some sacrificial material 215 is remained on the sacrificial layer 210.

In this embodiment, each first opening 211 has a width less than a width of the corresponding active area 113 and each second opening 212 has a width less than a width of the corresponding isolation area 116. It can prevent structures formed within the first opening 211 or the second opening 212 from extending beyond the corresponding active area 113 or isolation area 116 to have unexpected damage and current leakage.

Figure 2C:
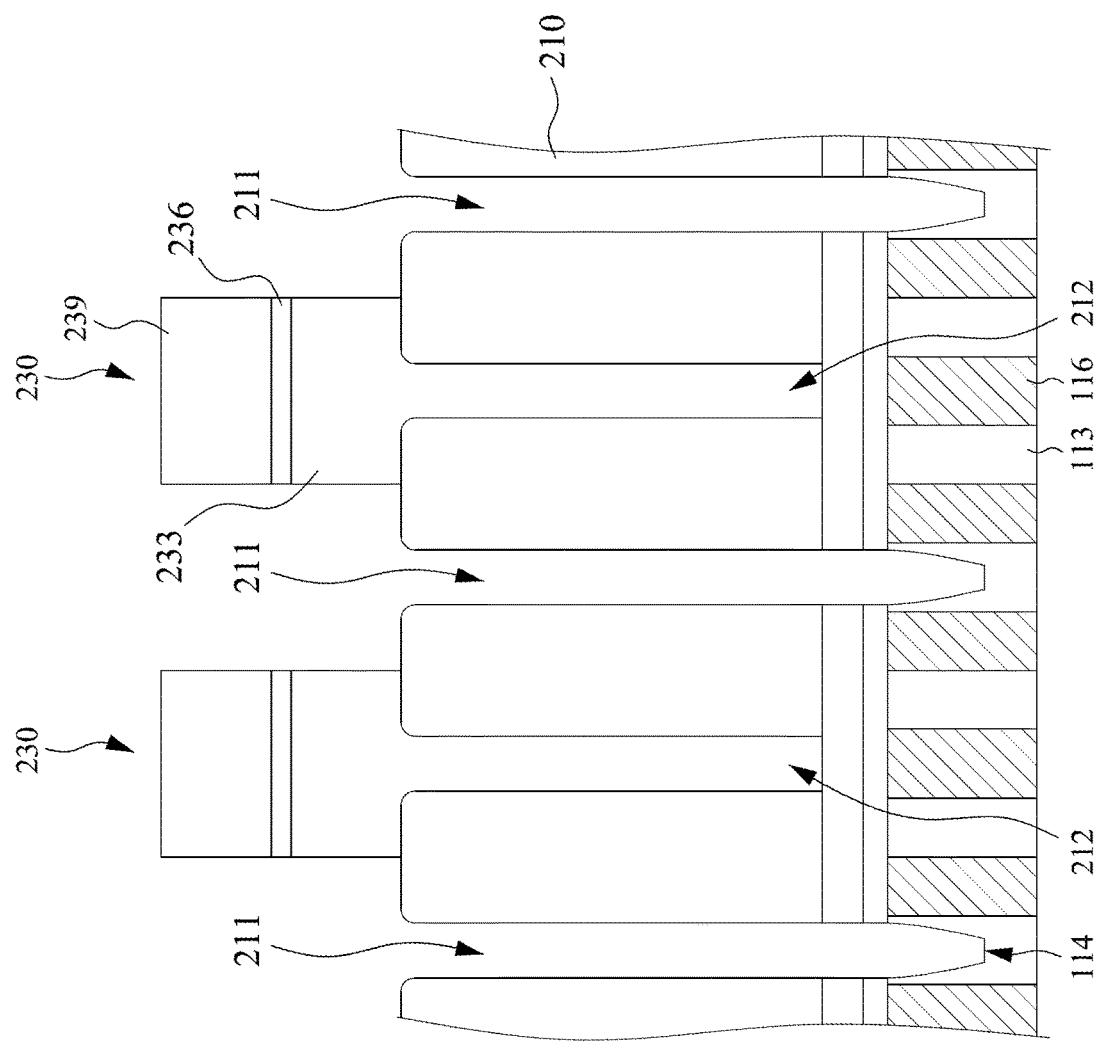

Continued with FIG. 2B, in FIG. 2C, extend bottoms of the first openings 211 within the active areas 113 to form a plurality of trenches 114. In this embodiment, the trenches 114 extend through the nitride layer 125 and the oxide layer 120 on the substrate 110 to the active areas 113 within the substrate 110. The trenches 114 can be regarded as bit contacts (BCs) of the active area 113, and the bit contacts of the active area 113 are formed to connect the formed first bit lines 130 in the following operations.

In this embodiment, before forming the trenches 114, a plurality of second hard masks 230 are formed in the second openings 212 for protecting. After the second hard masks 230 are formed, only the active areas 113 aligned with the first openings 211 are etched to form the trenches 114 from the bottom of the first openings 211. In this embodiment, each of the second hard masks 230 includes an under-layer 233, a silicon layer 236 and an oxide layer 239.

Figure 2D:
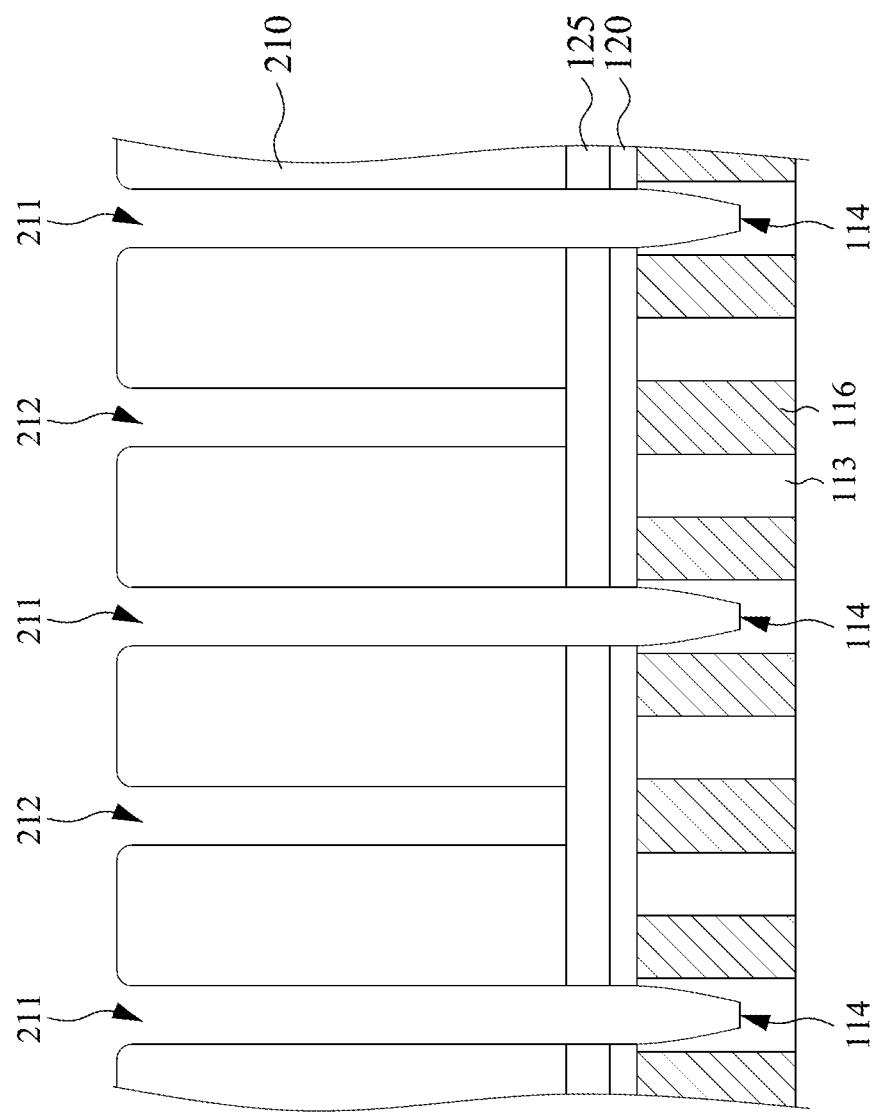

In FIG. 2D, the second hard masks 230 used for protecting are removed/striped after forming the trenches 114. The bottoms of the second openings 212 expose the top of the nitride layer 125.

Figure 2E:
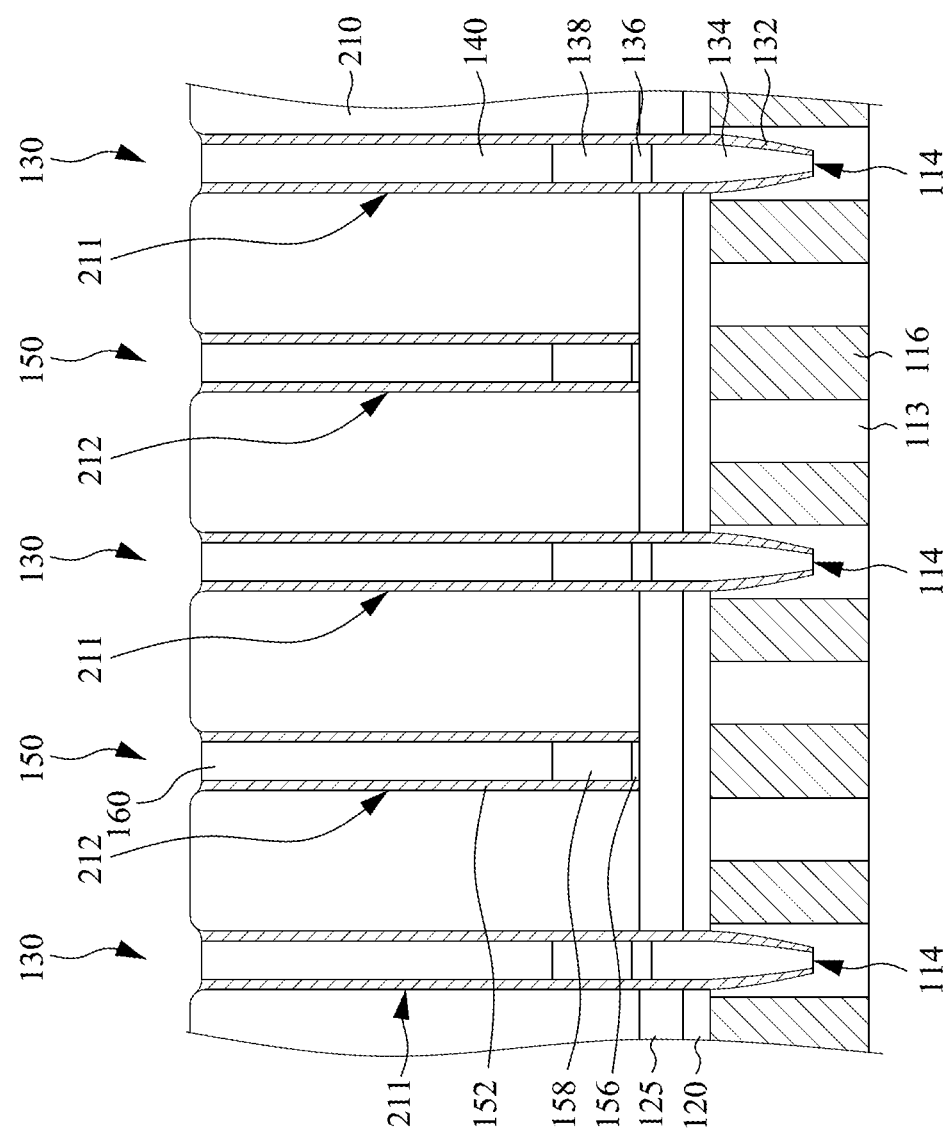

In FIG. 2E, form a plurality of first bit lines 130 in the first openings 211 and the trenches 114, and form a plurality of second bit lines 150 in the second openings 212.

For details, in some embodiments, respectively deposit insulating layers 132 and 152 in the first openings 211 and the second openings 212 first. Portions of the insulating layers 132 extend to the trenches but still expose the active areas. The insulating layers 152 extend to the top of the nitride layer 125. Then, form conductive structures 134, 136 and 138 and a nitride layer 160 within the trenches 114 and the first openings 211 in order, and form conductive structures 156 and 158 and a nitride layer 160 at the same time. In some embodiments, the conductive structures 134, 136 and 138 are deposited in the insulating layer 132 in order, and the conductive structures 156 and 158 are deposited in the insulating layer 152 sequentially. In this embodiment, the conductive structures 134 are exposed from the ends of the first bit line 130 at the trenches 114, so that the first bit lines 130 respectively directly connected to the active areas 113.

It should be note that each of the first bit lines 114 has a width less than a width of the corresponding active area 114 since the width of the first opening 211 is less than the width of the corresponding active area 113. Each forming conductive structures 134 at the bottom of the first bit line 130 is surrounded by the active area 113. Similar, each second bit line 150 has a width less than a width of the corresponding one of the isolation area 116.

In this embodiment, each of the second bit lines 150 is located on an oxide layer 120 and a nitride layer 125, and bottom portions of the second bit lines 150 have difference height with respect to the bottom portions of the first bit lines 130. The oxide layer 120 and the nitride layer 125 avoid unexpected electrical connections between active areas 113 and the second bit lines 150 if the second bit lines 150 extend out of the isolation areas 116.

Figure 2F:
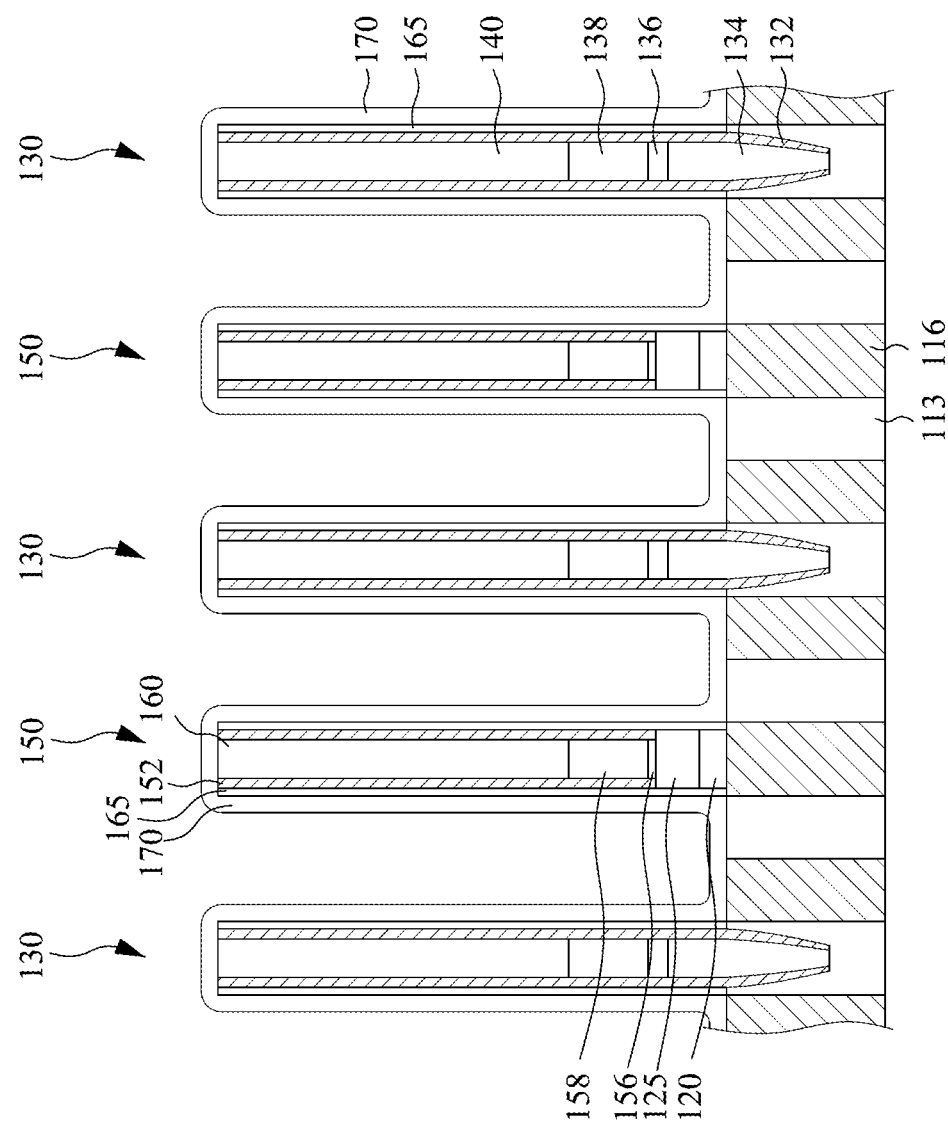

Proceed to FIG. 2F, the sacrificial layer 210 is removed, and then the spacing layers 165 and 170 are formed to cover the first bit lines 130 and the second bit lines 150.

Figure 2G:
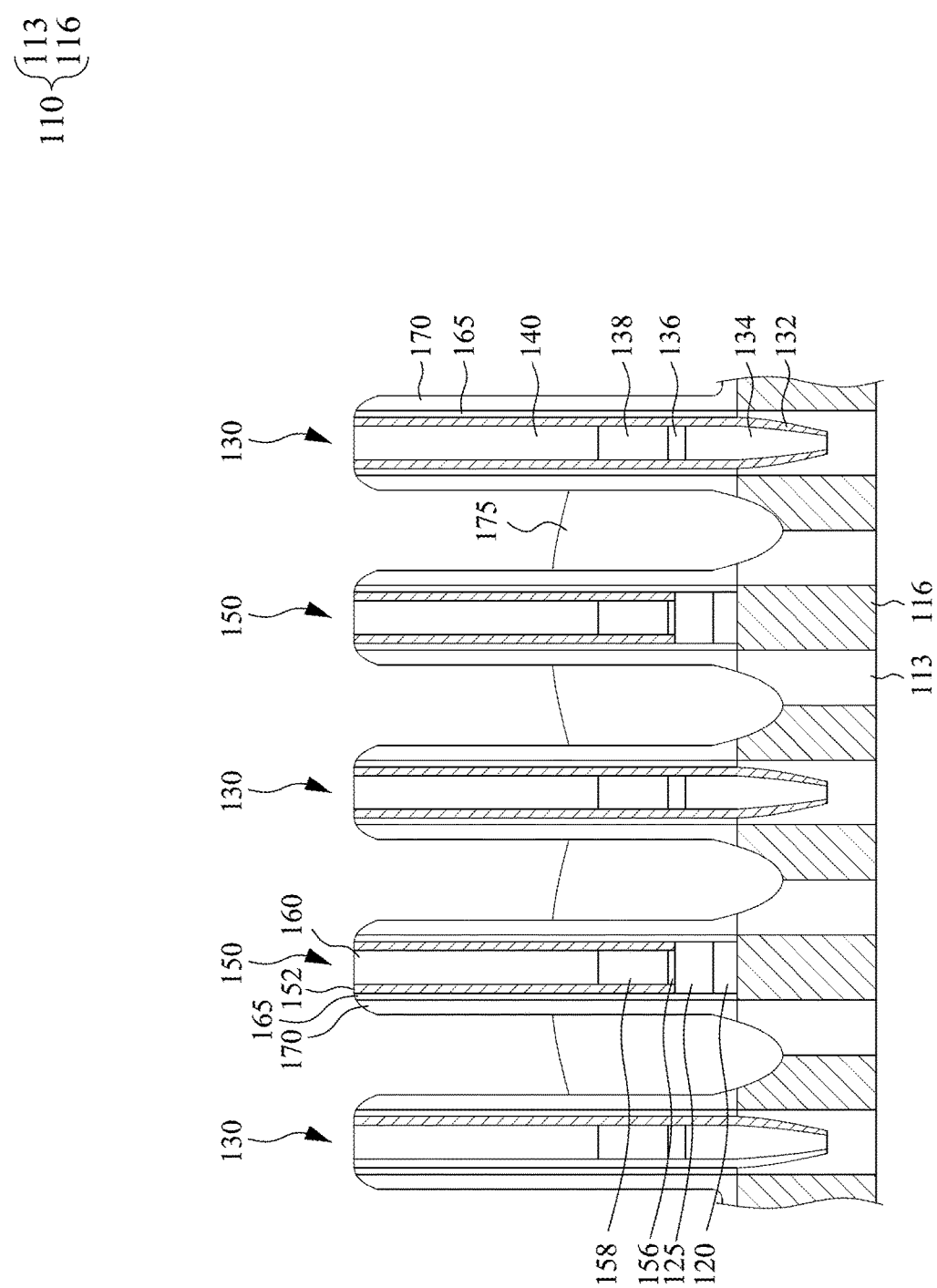

Continued with FIG. 2F, in FIG. 2G, portions of the substrate 110 in which between the bit lines including the first bit lines 130 and second bit lines 150 are further removed, tops of the spacing layers 165 and 170 are also removed, and then the spacing material 175 is formed between any two immediately-adjacent ones of the first bit lines 130 and second bit lines 150 to avoid current leakage. In some embodiments, the spacing material 175 is nonconductive. The nitride layers 140 of the first bit lines 130 protect the conductive structures 134, 136 and 138 during removing of portions of the substrate 110. The nitride layers 160 of the second bit lines 150 protect the conductive structures 154, 156 and 158 during removing of portions of the substrate 110.

In summary, a self-aligned manufacturing is performed through the mentioned method. The sacrificial layer makes formed bit lines be aligned to corresponding active areas or isolation areas and avoids conductive material residual risk out of corresponding active areas or isolation areas. No addition align process is needed, and the mentioned method relax the footing of the formed bit lines.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
    a substrate having a plurality of active areas and isolation areas, wherein each isolation area is located between immediately-adjacent two of the active areas to isolate the active areas from each other;
    a first bit line formed on a first active area of the active areas, wherein a bottom portion of the first bit line extends within the first active area, and the bottom portion extending to the active area is surrounded by the first active area;
    an oxide layer formed on the substrate;
    a nitride layer formed on the oxide layer, wherein the first bit line extends within the first active area through the oxide layer and the nitride layer; and
    a second bit line formed on the nitride layer and aligned with a first isolation area of the isolation areas, wherein a second isolation area of the isolation areas is located between the first isolation area and the first active area.

2. The semiconductor structure of claim 1, wherein the bottom portion of the first bit line has a first width at a level of a top of the first active area, an end of the bottom portion within the first active area has a second width, and the first width is greater than the second width.

3. The semiconductor structure of claim 1, wherein the first bit line comprises:
    a conductive structure located at the bottom portion, wherein the conductive structure extends within the first active area; and
    an insulating layer located between the conductive structure and the first active area, wherein the insulating layer surrounds the conductive structure, and the conductive structure is exposed from an end of the bottom portion to be connected to the first active area.

4. A method of semiconductor structure manufacturing, comprising:
    providing a substrate having a plurality of active areas and a plurality of isolation areas, wherein each isolation area is located between immediately-adjacent two of the active areas to isolate the active areas from each other;
    forming an oxide layer on the substrate;
    forming a nitride layer on the oxide layer;
    forming a sacrificial layer on the nitride layer upon the substrate;
    forming a plurality of first openings respectively aligned with the active areas, wherein each first opening has a width less than a width of a corresponding one of the active areas, wherein the first openings extends within the active areas through the oxide layer and the nitride layer;
    extending bottoms of the first openings within the active areas to form a plurality of trenches;
    forming a plurality of second openings in the sacrificial layer, wherein each second opening is located between two immediately-adjacent first openings and aligned with a corresponding one of the isolation areas;
    forming a plurality of first bit lines in the trenches, wherein each first bit line is connected to the corresponding one of the active areas;
    forming second bit lines in the second openings, wherein each of the second bit lines is formed on the nitride layer and aligned with a first isolation area of the isolation areas, wherein a second isolation area of the isolation areas is located between one of the first isolation areas and one of the active areas in which the first bit lines are formed on; and
    removing the sacrificial layer.

5. The method of claim 4, wherein before forming the first openings and the second openings, the method further comprises:
- forming a plurality of masks on the sacrificial layer; and
- reversely etching the masks and the sacrificial layer such that sacrificial layer has portions corresponding to the masks are removed to form the first openings and the second openings.

6. The method of claim 5, further comprising:
- forming a plurality of protecting hard masks in the second openings before forming the trenches; and
- removing the protecting hard masks after forming the trenches.

7. The method of claim 4, further comprising:
- forming spacers covering the first bit lines after removing the sacrificial layer.

\* \* \* \* \*